United States Patent [19]
Cohen et al.

[11] Patent Number: 5,390,141
[45] Date of Patent: Feb. 14, 1995

[54] VOLTAGE PROGRAMMABLE LINKS PROGRAMMED WITH LOW CURRENT TRANSISTORS

[75] Inventors: Simon S. Cohen, Burlington; Jack I. Raffel, Lexington, both of Mass.

[73] Assignee: Massachusetts Institute of Technology, Cambridge, Mass.

[21] Appl. No.: 88,253

[22] Filed: Jul. 7, 1993

[51] Int. Cl.$^6$ ............................................. G11C 13/00
[52] U.S. Cl. ........................................ 365/96; 365/94; 365/189.01
[58] Field of Search .................. 365/94, 96, 189.01, 365/230.01

[56] References Cited

U.S. PATENT DOCUMENTS

| | | | |
|---|---|---|---|
| 3,245,051 | 4/1966 | Robb | 365/96 |
| 3,582,908 | 6/1971 | Koo | 365/96 |
| 3,863,231 | 1/1975 | Taylor | 365/96 |
| 4,042,950 | 8/1977 | Price | 365/96 |
| 4,758,745 | 7/1988 | Elgamal et al. | 307/465 |
| 4,823,181 | 4/1989 | Mohsen et al. | 357/51 |
| 4,876,220 | 10/1989 | Mohsen et al. | 437/170 |
| 4,881,114 | 11/1989 | Mohsen et al. | 357/54 |
| 4,899,205 | 2/1990 | Hamdy et al. | 357/51 |
| 4,910,417 | 3/1990 | Hamdy et al. | 387/468 |
| 4,943,538 | 7/1990 | Mohsen et al. | 437/52 |
| 5,057,451 | 10/1991 | McCollum | 437/69 |
| 5,070,384 | 12/1991 | McCollum | 357/51 |
| 5,171,715 | 12/1992 | Husher et al. | 437/195 |

OTHER PUBLICATIONS

U.S. Pat. application No. 08/022,980 filed Feb. 25, 1993.
U.S. Pat. application No. 07/949,891 filed Sep. 23, 1992.
U.S. Pat. application No. 08/068,798 filed Jun. 1, 1993.
U.S. Pat. application No. 07/735,427 filed Jul. 25, 1991.
U.S. Pat. application No. 07/860,678 filed Mar. 30, 1992.
U.S. Pat. application No. 07/918,586 filed Jul. 22, 1992.

*Primary Examiner*—Terrell W. Fears
*Attorney, Agent, or Firm*—Hamilton, Brook, Smith & Reynolds, P.C.

[57] ABSTRACT

An electrical path can be formed through a transformable insulator between first and second conductors by applying a voltage between such conductors across at least one selected region of the insulator. Much of the current required to complete the link is provided from parasitic capacitance of the writing circuit or from capacitance which is removable from the circuit during normal operations. As a result, small transistors of less than 100 microamps may be used in the writing circuit which applies the programming voltage.

16 Claims, 5 Drawing Sheets

VOLTAGE PROGRAMMABLE LINKS PROGRAMMED WITH LOW CURRENT TRANSISTORS

The U.S. Government has rights in this invention pursuant to Contract No. F19628-90-C-002 awarded by the Department of the Air Force.

BACKGROUND

The technical field of this invention is solid state integrated circuit fabrication and, more particularly, methods for programming voltage programmable link structures sometimes called antifuses.

Programmable conductive paths, particularly "links" between two or more distinct layers of conductive materials such as metals, polysilicon or doped silicon are increasingly employed in solid-state integrated circuit fabrication to produce a variety of programmable circuits including, for example, field programmable gate arrays ("FPGAs"), programmable read only memories ("PROMs"), and other programmable electronic devices.

Most typically, such devices are "programmed" by the application of an electrical voltage to breakdown a dielectric disposed between two conductive layers and thereby establish an electrical connection across a region of the device which had previously been an insulator.

To be useful, link structures must remain insulating at the normal operating voltage for solid state devices (e.g., nominally five volts). On the other hand, they must reliably "break down" in response to a programming voltage which is higher than the normal operating voltage, but not so high as to damage other structures on the circuit (e.g., not more than about fifteen volts).

It is believed that there is a three stage process of breaking down the insulating layer and rendering it conductive. During the first high resistance stage of this process, the programming voltage, which may typically be in the range of between 20 and 10 volts, produces a low current with a current density of less than 10 $mA/cm^2$ for periods of 0.01 to 10 milliseconds. At the end of this time, the conductance increases sharply and in a period measured in nanoseconds a typical link decreases in resistance by some ten orders of magnitude to a value of tens of ohms. This in turn causes a sudden increase in the current. In the final stage, which may last several microseconds, chemical reactions continue until a low resistance link is obtained. The final value of resistance depends on the amount of current passed through the link during the second and third stages. Typically, the current density that yields a ten ohm resistance value is $10^4$ $A/cm^2$ or larger.

In a practical application such as in a field programmable gate array, transistors are deployed to provide the switching current necessary to leave the programmed links in a low resistance state. In one such commercial embodiment, it is necessary for these transistors to provide as much as five milliamps of current which in turn requires that the transistors be very large. Further, a number of these transistors may be in series, requiring a still further increase in transistor width to provide the necessary programming current. As a result of these requirements, there is a considerable waste in silicon area devoted to these programming transistors that could be better used to provide more logic modules to improve the overall functional capability of these arrays.

SUMMARY OF THE INVENTION

In accordance with the present invention, the large transistors previously required to convert a transformable insulator into a low resistance link are obviated. The necessary programming currents are provided from energy stored locally on capacitors rather than through the large transistors. Smaller transistors charge these capacitors prior to breakdown of the link. These smaller transistors reduce the area required for programming transistors and thus allow more room for logic modules and improve the overall capability of the circuits.

These smaller transistors are able to charge the capacitors over a longer period of time than that during which they are discharged, so they need only carry current levels which are substantially less than that required to transform a link. It has been found that with the present invention, the writing transistors need supply a current of only 100 microamps, and preferably only ten microamps or less, by providing sufficient capacitance relative to the link structure such that the programming circuit is able to provide the milliamps of current required for the actual breakdown process over a short period of time (on the order of a few nanoseconds or below). As a result, the large area programming transistors, required to supply a large current in typical programmable link circuits, are no longer required.

A preferred programmable link structure which is programmable by reliance on charge stored only on parasitic capacitance comprises an insulative link including silicon rich oxide between conductive elements. More specifically, the preferred insulative link includes nitride barriers sandwiching the oxide layer and is formed by a low temperature plasma enhanced chemical vapor deposition process. Each conductive element comprises a layer of nonrefractory conductive material such as aluminum, refractory conductive material such as titanium sintered into the aluminum and a thin layer of metal such as aluminum facing the insulative link. The thin layer of metal should comprise a metal that does not react with the insulator under normal fabrication conditions. The preferred metal alloy is aluminum (1% Si).

If desired, the present invention may be extended to link structures which require more energy for the transformation, such as structures presented in various U.S. patents of Actel Corporation. Such structures require the introduction of extra capacitance. The extra capacitance may be added only during a programming mode and may be removed during an operational mode. Removal of the extra capacitance avoids undue loading on the logic circuits during the operational phase of the circuits after the interconnect has been programmed, thus avoiding the deleterious effect of the capacitance on the speed of operation of the circuits. The extra capacitance may be switched in with additional transistors in the programming mode and disconnected by the transistors during the operational mode. Alternatively, a voltage controlled capacitance may be used with its value modulated by the application of a bias voltage. The voltage controlled capacitance thus varies between a high value suitable for programming and a lower value required during operation.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

The present invention may be applied to virtually any type of link structure including those disclosed by Actel Corporation in a number of U.S. Patents. However, the invention is particularly applicable to link structures which require a relatively small amount of energy to cause the transformation from insulator to low resistance link. A preferred link structure is that presented in U.S. patent application Ser. No. 07/918,568, filed Jul. 22, 1992 and application Ser. No. 07/949,891, filed Sep. 23, 1992.

Figure 1:
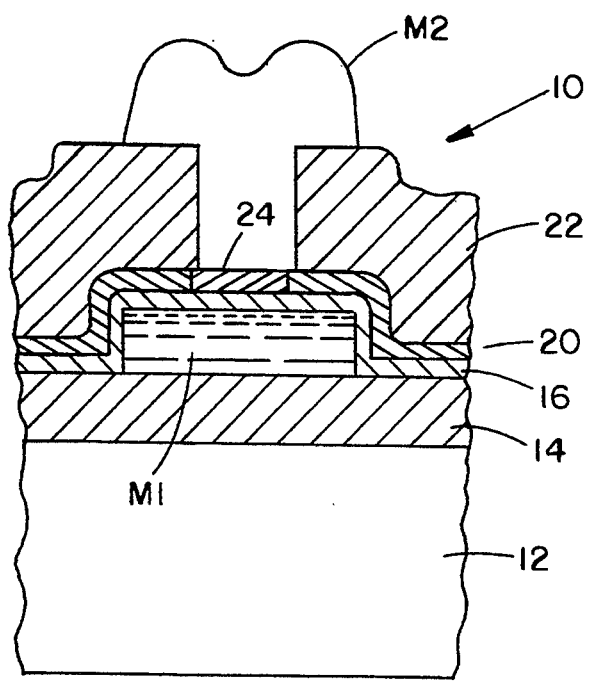
FIG. 1 is a sectional schematic view of one voltage programmable link structure which may be used in practicing the invention.

As shown in FIG. 1, the voltage programmable link structure 10 of application Ser. No. 07/949,891 is formed upon a silicon substrate 12. The link 10 further includes a field oxide layer 14 deposited over the substrate, a first metallization layer M1 deposited over the field oxide layer, a transformable insulator link material 16 deposited over the first metal layer, a thin film of an ion implanted conductive material (i.e., modified aluminum) 20 deposited over the insulator link material, an interlevel dielectric material 22 deposited over a portion of the ion implanted layer, and a second metallization layer M2 deposited over the interlevel dielectric material.

In the preferred embodiment, each of the first and second metallization layers is a three layer structure, and the structures are mirror images of each other. Each includes a first layer of a non-refractory conductive material, such as aluminum (1% silicon), and a capping of about 10-50 nanometers of refractory conductive material such as titanium. With sintering, the refractory material diffuses into the aluminum to prevent the first and second metal layers from having marked surface irregularities known as "hillocks" that occur during sintering and other device processing steps. The first and second layers each have a final layer, such as 10-50 nanometers of aluminum (1% silicon) to prevent interaction with the transformable insulating layer.

Once the first conductive element 14 has been formed, it is overlaid with the transformable link insulator material 16, at least at each programmable link site. The link material is preferably a silicon oxide insulator and can also include one or more other insulating layers to physically separate the silicon oxide from the first and second conductive elements. In the preferred embodiment, silicon nitride layers sandwich the silicon oxide layer to protect it from the metallization layers M1 and M2. This minimizes the chance of chemical reactions degrading the structure over time. These three layers each have a thickness ranging from about 5 to about 30 nm, preferably less than 15 nm, with 8 nm being the preferred size. The thickness of these layers may vary with particular applications, but it is necessary that they be designed to cause the link material to become conductive as a suitable voltage is applied from the second metal layer 24 to the first metal layer M1.

The various link insulator components are preferably deposited by using plasma-enhanced chemical vapor deposition (PECVD) rather than thermal growth or thermal chemical vapor deposition (CVD). PECVD is a highly controllable process and, since it is performed at a relatively low temperature, aluminum can be used as a first layer conductor, rather than conductors with a higher melting point such as polysilicon. Also, thermally grown oxides tend to be very robust so that even very thin layers require high programming voltages. The use of PECVD oxide and nitride layers allows the use of a thicker insulator layer, thereby reducing parasitic capacitances, while still retaining a low programming voltage.

Moreover, PECVD techniques permit control over the silicon content. In forming the link structures of the present invention, silicon-rich insulators have been found useful. In some applications, it may be preferable to deposit silicon-rich compositions with up to twice as much silicon as the normal ($SiO_2$ and $Si_3N_4$) stoichiometric formulae. For example, when silicon-rich compositions are desired, the oxide layers of the link compositions can be described by the formula: $SiO_x$, where x can range from about 1.5 to about 2.0, and the nitride layers can be described by the formula: $SiN_y$ where y can range from about 0.32 to about 1.3.

Following the deposition of the transformable insulator link structure is the deposition of the thin film of conductive material 20. The conductive material is preferably aluminum, but may be a sandwich of aluminum and titanium or molybdenum or amorphous or polycrystalline silicon. The thin aluminum layer serves as a base pad for the second metal layer M2 and as an etch stop and need not be thicker than about 30 nm. Ion implantation is used to delineate the patches of nonconductive and conductive regions. The conductive regions 24 serve to link the first and second metal layers and the remaining nonconductive regions formed by ion implantation serve to isolate the links. Either nitrogen or oxygen ions are implanted in the aluminum surface, yielding aluminum nitride (AlN) or alumina ($Al_2O_3$) regions, respectively. The aluminum nitride and alumina patches are nonconductive while regions of the conductive layer 20 that were not ion implanted remain conductive.

Once the deposited aluminum layer 20 is implanted with nitrogen or oxygen ions, the interlevel dielectric material 22 is then deposited over the entire ion implanted aluminum surface. Then, a portion of the dielectric material is etched away leaving a window over the conductive patch. The etched window is then filled with the second metal layer M2. An electrical path is formed between the first and second conductive elements at selected patches by applying a voltage across the insulator thereby transforming the insulator into a conductive state.

The ability to program the present link structures with low current leads to the ability to write them using the energy stored in available parasitic capacitance. This is a significant advantage because it eliminates the need for the large area drive transistor employed in existing technologies, thus increasing device density.

Figure 2:
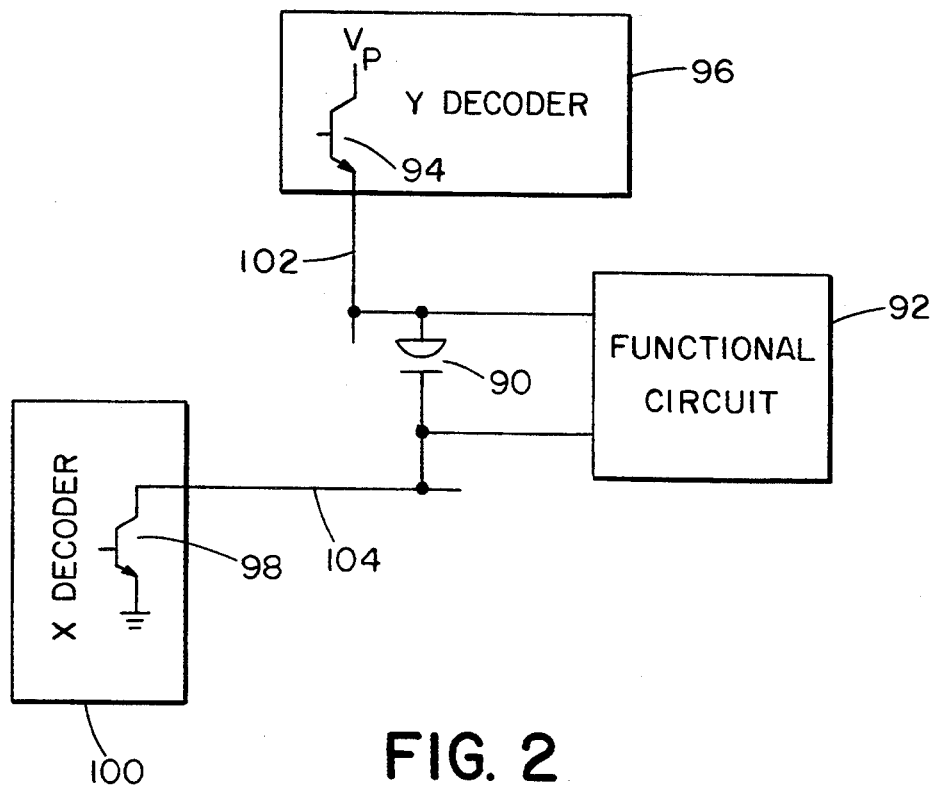
FIG. 2 is an electrical schematic illustration of one link structure programming circuit embodying the invention.

An illustrative programming circuit for a programmable link structure is presented in FIG. 2. Although only a single link structure 90 is shown, it will be recognized by those skilled in the art that the link structure 90 is one of an array of such structures. The link structures 90 may be coupled in a memory array or, as illustrated in FIG. 2, into functional circuits 92 such as those found in a field programmable gate array. In writing the link 90 to convert it to a low resistance path, a voltage is applied across the structure through a transistor 94 in a Y decoder 96 and a transistor 98 in an X decoder 100. The line 102 from the Y decoder would be connected to a column of link structures while the line 104 would be coupled to a row of such structures. The link structure 90 coupled to the enabled Y transistor 94 and X transistor 98 would have the programming voltage applied across it to create the conductive path.

The current through transistors 94 and 98 would charge the parasitic capacitance associated with the link structure 90. That parasitic capacitance comprises the capacitance of the link itself as well as that of the leads to the link including leads 102 and 104. When the writing transistors 94 and 98 conduct current prior to breakdown of the link structure 90, charge builds on the parasitic capacitance. Then, the link structure breaks down under the stress of the electric field thereacross and the charge stored on the parasitic capacitance immediately discharges through the lowered resistance of the link to complete the process of forming a low resistance path through the link 90.

Figure 3A:
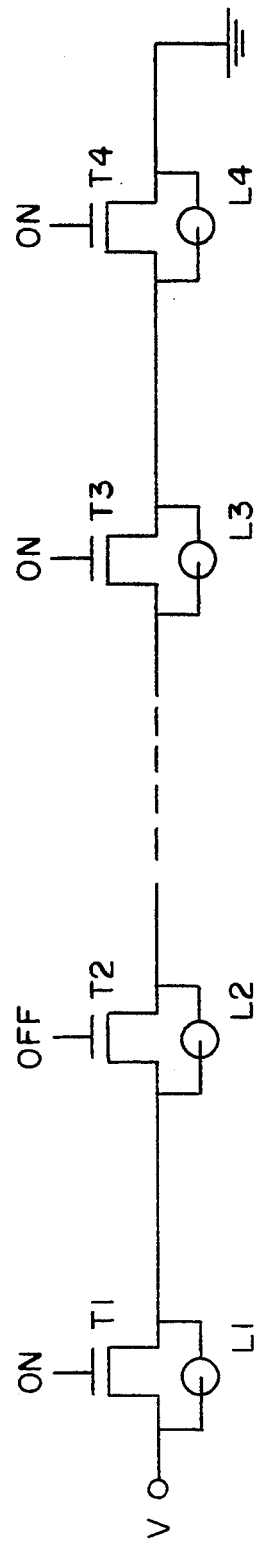
FIG. 3A is an electrical schematic illustration of another link structure programming circuit embodying the invention.
Figure 3B:
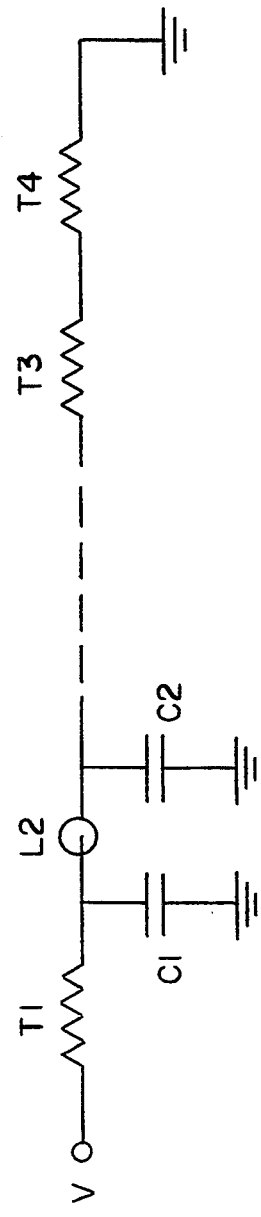
FIG. 3B is an equivalent circuit of the circuit of FIG. 3A.

Another illustration of a programming circuit is presented in FIG. 3A. Here, each link structure L1, L2, L3 and L4 of a row of such structures is connected in parallel with a transistor T1, T2, T3 or T4. As illustrated, transistors T1, T3 and T4 are biased on, thus preventing any significant voltage thereacross with application of the programming voltage V. Link L2 is to be transformed, however, and the transistor T2 is biased off. As a result, when voltage V is applied, current initially does not flow through transistor T2 of link L2. Current does flow through transistors T1, T3 and T4, however, to charge the parasitic capacitance of the circuit. As illustrated in the equivalent circuit of FIG. 3B, the transistors T1, T3 and T4 appear as resistors through which parasitic capacitances, C1 and C2 associated with the link L2 is charged. Because the transistors are relatively small, the resistances of those transistors is sufficiently large to hold the current flow through the transistors to under 100 microamps. However, the parasitic capacitance C1 and C2 is charged over a period of milliseconds and then discharged within nanoseconds with breakdown of L2. That prompt discharge of the parasitic capacitance creates the transformation of the link to a low resistance path.

Figure 4:
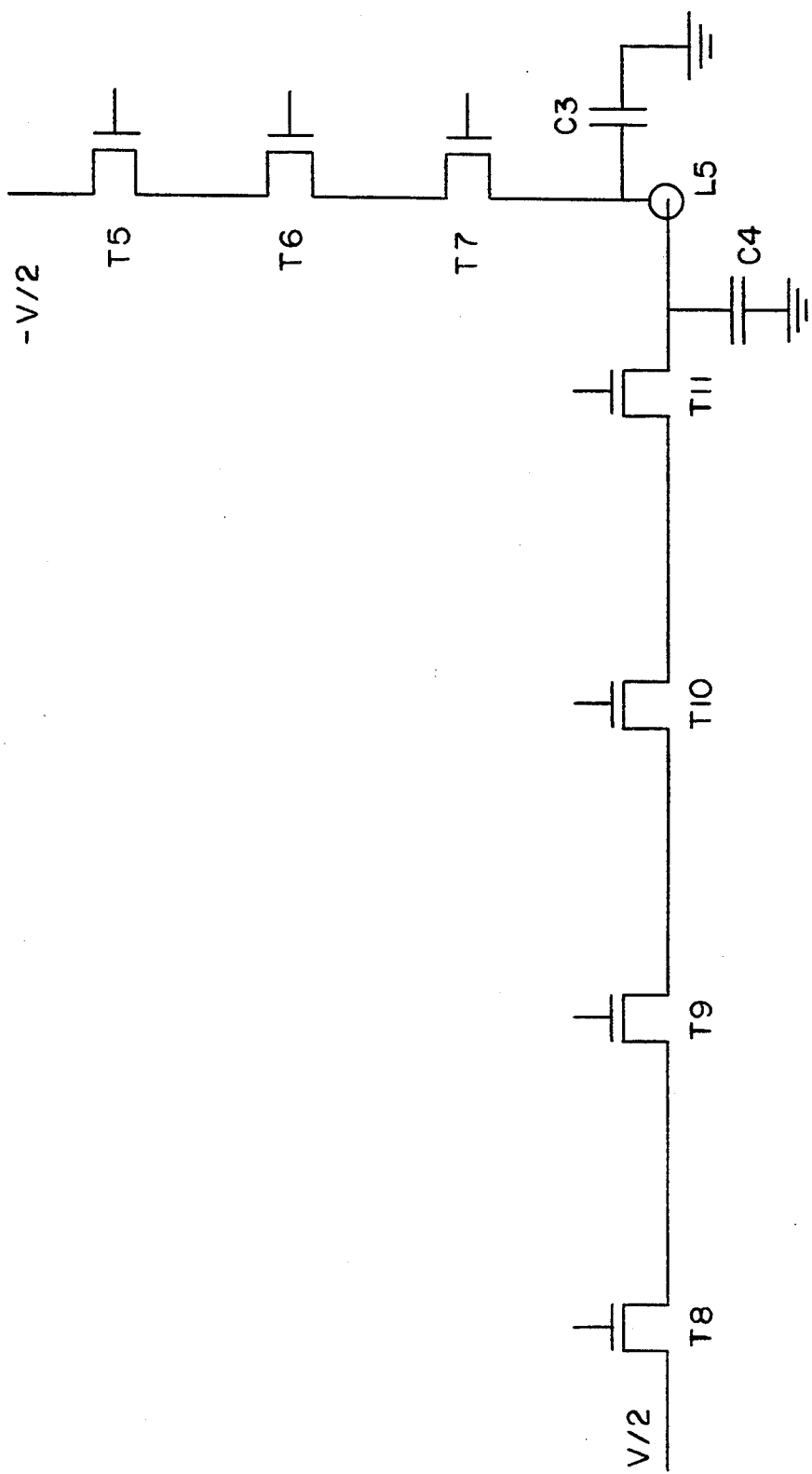
FIG. 4 is yet another programming circuit embodying the invention.

A third programming circuit is illustrated in FIG. 4. Here, a link L5 is positioned at the crossover between a vertical circuit of transistors T5, T6, and T7 and a horizontal circuit of transistors T8, T9, T10 and T11. Each of these transistors may itself be associated with a link or it may be a part of any other functional circuit. Associated with the link L5, between the link and respective transistors T7 and T11, are the parasitic capacitors C3 and C4. When the transistors T5-T11 are turned on, the parasitic capacitors C3 and C4 are charged until breakdown of the link L5. The capacitors then discharge through the link to complete the low resistance path.

It is believed that the writing of any voltage-programmable link (VPL) results from a combination of Joule heating and chemical reactions, with the possibility that some mechanical effects may also contribute to link formation in certain cases. Joule heating results from the passage of large currents through the filament created during link formation. The required current densities may either be provided by outside means (a large drive transistor in existing technology) or, in accordance with the present invention, by making use of charge dumping from parasitic capacitances. The level of current necessary for securing a low resistance link is in the range of a 1–10 mA, depending on the actual structure and composition of the particular VPL.

The breakdown process used for writing links of both the prior art and this invention is believed to proceed in three steps. First, the electric field must be applied for a period of time during which the insulator is stressed without current flow. The length of this step depends on the field strength. During this period, current flow of microamps through transistor 94 and 98 charges parasitic capacitances. At the end of this period in a second step, a filament forms in the insulator if sufficient current is available. This current is typically of the order of nanoamps per square micrometer of link for the preferred link structure disclosed above. The final step is growth of the filament, by a combination of physical and chemical processes. Mechanical effects may include fracture of the insulator films, removal of material by boiling, and outgassing due to decomposition of certain insulator materials. More importantly, chemical reactions between the metallization agents and the components of the insulator lead to the final composition of the filament, which determines the filament conductivity. The relevant chemical reactions, however, require a relatively long time to proceed to completion, as compared with the actual time that it takes the insulator to breakdown (below about 3 ns). We estimate this reaction time to be of the order of a few microseconds in the preferred metal-based structures, and apparently much longer times in silicon-based link structures. For conventional links, continued heating of the link is obtained by continued current flow from high current transistors through the reaction time. As discussed below, however, with the present invention high temperatures obtained during the second step are sufficient to complete the reaction in the third step.

The dumping process must be completed in a sufficiently short period of time in order to generate the high power required for driving the necessary physiochemical processes involved in the link formation. Other important parameters are the composition and geometry of the link structure, and the nature of the chemical reactions. The former determine the rate of heat dissipation, while the latter govern the link's final composition. If the heat generated during the breakdown process were to diffuse prior to the completion of the chemical reaction, one would, at best, end up with a high resistance link. Hence, when the immediate link region provides a good heat sink as in the case of a link to the substrate, a source which supplies energy continuously must be utilized. In existing technology this is provided by a large drive transistor turned on for a relatively long periods of time, of the order of several milliseconds.

In the preferred link structure, the link is isolated from the substrate by a layer of interlevel oxide so high temperatures obtained during the second step are held for a longer period of time. Moreover, the melting point of aluminum (933 K.) is markedly below that of silicon (1638 K.) so that the chemical reactions that are particularly effective once the melt has formed proceed more easily in the aluminum-based system. One also notes that the chemical affinity of aluminum (and titanium which makes part of the metallization in our preferred embodiment) towards both the oxide and nitride components of the link's insulator is high. In comparison, the reduction reaction of these materials in the presence of a surplus of silicon is not favored thermodynamically; the linking in such a system relies mostly on physical (mechanical) effects. All of these effects lead to the observed phenomena: a fast and effective link formation process when the capacitors plates are aluminum, and a rather slow process for silicon-based structures.

Two link structures that differ in the value of the insulator's thickness (7.5 nm/7.5 nm/7.5 nm and 10 nm/15 nm/10 nm nitride/oxide/nitride (NON) structures) have been tested. The applied voltage in both cases was 13 V with a characteristic rise time of below 5 $\mu$s. In each case, three groups of devices were compared. Each group had the same self capacitance but the pad capacitance varied owing to different pad sizes. Time-to-breakdown (mostly, the stress component) was recorded but does not seem to be a factor in the observed final resistance values.

Two main results are noted. First, the flat-aluminum/NON-based voltage programmable link is amenable to writing by utilizing parasitic charge dumping. Values of the final resistance which are as low as 10 Ohms were obtained without requiring large external current sources (drive transistors). The resistance ranged from 2 KOhms to 10 Ohms for parasitic capacitances of 0.2 pF to 1.2 pF, respectively. This is in marked contrast with the results obtained from silicon-/ONO-based links. The explanation, as stated above, is believed to be the melting temperature of aluminum which is much lower than that of silicon, and the affinity of aluminum towards either oxide or nitride which is much higher than that of silicon towards either one.

Whereas conventional link structures typically require in the order of 10 milliamps over 10 milliseconds to write a structure, the present preferred structure breaks down in less than 3 nanoseconds. Over that short period of time, the charge transferred during charge dumping constitutes current of milliamps which results in high temperature heating of the link. Due to the short dumping time, the high current across the link is obtained despite the use of standard transistors 94 and 98 which will typically conduct no more than 100 microamps. Thus, standard transistors can be used to slowly charge the parasitic capacitance during the first step of the process. Then in accordance with the present invention, the required milliamps for growth of the filament are provided through rapid charge dumping from parasitic capacitances.

For a given resistance value of the final transformed link, a particular link structure will require a certain level of energy to be supplied by the dumping capacitances. If the usual parasitic capacitance of the circuit design is insufficient, the dumping capacitance may be increased by intentionally augmenting inherent capacitance due to the link itself and associated wiring. For example, the length of the lead leading to the link may be increased.

The use of charge stored on dumping capacitance to drive current through the links during programming can be extended to more conventional silicon/ONO-based links by thus increasing the capacitance associated with the programming Circuit. The increased capacitance stores a greater charge prior to breakdown and thus allows for dumping of a larger amount of energy through the link after breakdown. On the other hand, such increased capacitance degrades performance if left in the circuit during normal operation. Accordingly, for such structures, additional capacitance may be switched into the circuit during the programming mode and removed during normal operation.

Figure 5:
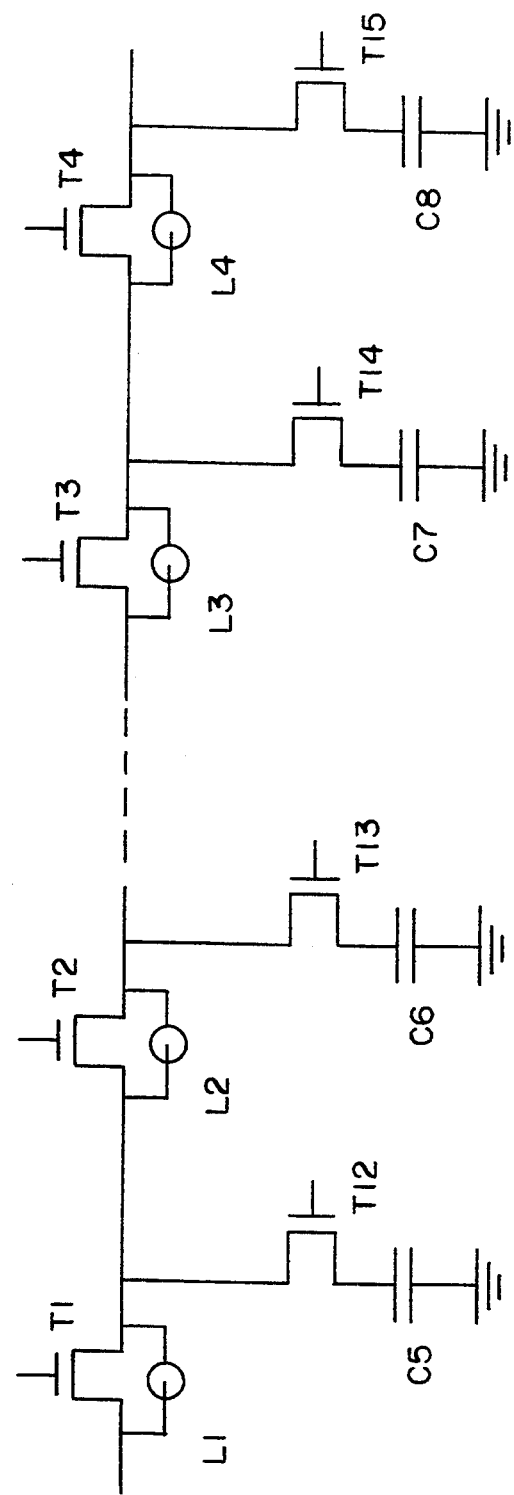
FIG. 5 illustrates a modification of the circuit of FIG. 3A Using additional switched capacitors.

A modification of the circuit of FIG. 3A to provide additional switched capacitance is illustrated in FIG. 5. In this example, the parasitic capacitances are supplemented by capacitances C5, C6, C7 and C8 which may be switched into the link circuit by transistors T12, T13, T14 and T15. If link L2 is being transformed, T2 is gated off while transistors T1, T3 and T4 were gated on as before. Further, transistors T12 and T13 are gated on to switch extra capacitors C5 and C6 into the circuit to provide additional dumping capacitance in association with the link L2. Although this circuit increases the number of transistors, those transistors are small. The capacitance switches are never in series, so they do not present a cumulative resistance to the charge dumping path. This switched capacitor approach may be used in any circuit design, including those of FIGS. 2 and 4.

Figure 6:
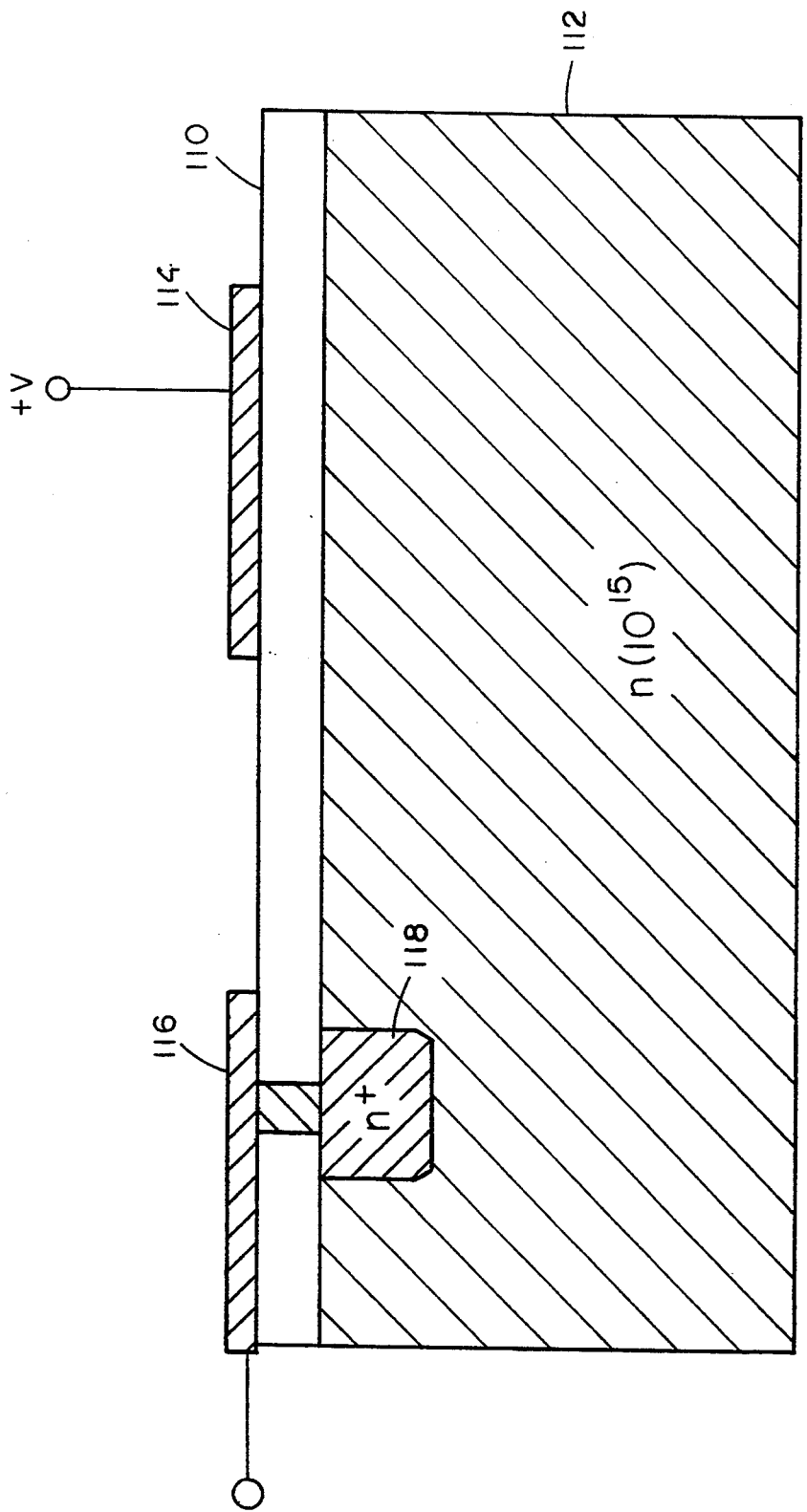
FIG. 6 is a sectional schematic view of a possible variable capacitor for use in place of the switched capacitors of FIG. 5.

Alternatively, each of the switched capacitor circuits can be replaced by a variable capacitor which has a high capacitance during programming but a lower capacitance during operation. A possible variable capacitor structure is illustrated in FIG. 6. An oxide layer 110 is formed on a highly doped ($10^{15}$) n-type silicon substrate 112. The oxide layer preferably has a thickness of 20 to 30 microns. A polysilicon plate 114 is formed over the oxide layer 110. The n substrate is coupled to a biased conductor 116 through a heavily doped diffusion region 118. The polysilicon plate 114 would be coupled to the link structure. During normal operation, a positive voltage would be applied to bias conductor 116 to deplete the silicon substrate. The depletion region thickness would reduce the capacitance of the device. However, during programming a negative voltage would be applied to the bias conductor to cause accumulation of electrons at the oxide layer so that the oxide thickness alone determines the capacitance, resulting in increased capacitance.

While this invention has been particularly shown and described with references to preferred embodiments thereof, it will be understood by those skilled in the art that various changes in form and details may be made therein without departing from the spirit and scope of the invention as defined by the appended claims.

For example, the term "aluminum" as used herein is intended to encompass not only pure aluminum but also various aluminum alloys, including AlSi, AlSiCu, AlCu, AlTi, AlCuCr and the like which are known and used routinely in the semiconductor industry.

Also, the terms "first" and "second" metallization layers are used herein to distinguish between lower and upper metallization lines. It should be clear that the "first" metallization line need not be the first or lowest conductive path in the integrated circuit. Likewise, the "second" layer need not be the only other metallization layer. There may be other metallization layers that do not enter into the programmable link.

Moreover, the invention can be practiced to establish links between more than two conductive layers, the term "first" and "second" being merely shorthand expressions for the bottom and top of the conductive path, respectively. Likewise, the term "substrate" is used herein to describe various layers which may lie below the "first" metallization layer, including the bulk silicon of the wafer, active devices (e.g., sources, gates and/or drain regions), gate oxide layers, and other structures as the case may be. Finally, it should be appreciated that the link structures and methods of the present invention need not be limited to silicon-based devices, but rather can also find applications in other semiconductor devices, such as gallium arsenide structures and the like.

What is claimed is:

1. A method of electrically programming links comprising:

providing a link structure comprising a transformable insulator between conductive elements;

in a writing circuit having at least one writing transistor, applying a current toward but not through the link structure, at a current level less than a current level required to transform the transformable insulator to a conductor, to charge capacitance of the writing circuit and thereby apply a voltage across the link structure to stress the transformable insulator; and with breakdown of the transformable insulator at a breakdown voltage, supplying current through the link structure from the at least one transistor in the writing circuit and from the capacitance of the writing circuit at a current level through the link structure substantially exceeding the current through the at least one transistor in the writing circuit.

2. A method as claimed in claim 1 wherein the transformable insulator comprises silicon rich oxide and the conductive elements comprise metal.

3. A method as claimed in claim 2 wherein the conductive elements comprise aluminum.

4. A method as recited in claim 2 wherein the at least one transistor of the writing circuit supplies current of less than 10 microamps.

5. A method as claimed in claim 2 wherein the writing circuit comprises a parasitic capacitance which provides current through the link structure in the order of several milliamps.

6. A method as claimed in claim 1 wherein the writing circuit comprises a capacitance which provides current through the link structure in the order of several milliamps.

7. A method as claimed in claim 6 wherein the capacitance is parasitic capacitance.

8. A method as claimed in claim 1 wherein the at least one transistor of the writing circuit supplies current of less than 10 microamps.

9. A method as claimed in claim 8 wherein the writing circuit comprises a parasitic capacitance which provides current through the link structure in the order of several milliamps.

10. A method as claimed in claim 1 wherein is dumped from parasitic capacitance through the link structure within a few nanoseconds.

11. A method as claimed in claim 1 wherein current is dumped from capacitance which is removed from the link structure after programming.

12. A method as claimed in claim 11 wherein the capacitance is switched from the link structure.

13. A method as claimed in claim 11 wherein the capacitance is a variable capacitor.

14. A method as claimed in claim 1 wherein transistors of the writing circuit supply current of less than 10 microamps, and capacitance in the writing circuit provides current through the link structure in the order of several milliamps.

15. A method as claimed in claim 14 wherein current is dumped from the capacitance through the link structure within a few nanoseconds.

16. A method as claimed in claim 1 wherein current is dumped from a capacitance through the link structure within a few nanoseconds.

* * * * *

UNITED STATES PATENT AND TRADEMARK OFFICE
CERTIFICATE OF CORRECTION

PATENT NO. : 5,390,141
DATED : February 14, 1995
INVENTOR(S) : Simon S. Cohen and Jack I. Raffel It is certified that error appears in the above-identified patent and that said Letters Patent is hereby corrected as shown below:

Column 10, line 26, claim 10, after the word "wherein" insert --current--.

Signed and Sealed this

Sixth Day of June, 1995

*Attest:*

*Attesting Officer*

BRUCE LEHMAN
*Commissioner of Patents and Trademarks*